(12) United States Patent  
Saeki (10) Patent No.: US 8,541,891 B2
(45) Date of Patent: Sep. 24, 2013

(54) SEMICONDUCTOR DEVICE

(75) Inventor: Yoshihiro Saeki, Tokyo (JP)

(73) Assignee: Lapis Semiconductor Co., Ltd., Yokohama (JP)

(*) Notice: Subject to any disclaimer, the term of this patent is extended or adjusted under 35 U.S.C. 154(b) by 303 days.

(21) Appl. No.: 12/073,849

(22) Filed: Mar. 11, 2008

(65) Prior Publication Data

US 2008/0237892 A1 Oct. 2, 2008

(30) Foreign Application Priority Data

Mar. 30, 2007 (JP) ................. 2007-094716

(51) Int. Cl.
*H01L 23/48* (2006.01)

(52) U.S. Cl.
USPC .............. 257/778; 257/710; 257/787

(58) Field of Classification Search
USPC ............. 257/678, 700, 724, 725, 777, 778
See application file for complete search history.

(56) References Cited

U.S. PATENT DOCUMENTS

| 5,436,203 | A * | 7/1995 | Lin ................... 29/841 |
| 6,228,679 | B1 * | 5/2001 | Chiu .................. 438/108 |
| 6,614,122 | B1 * | 9/2003 | Dory et al. ............ 257/787 |
| 6,987,619 | B2 * | 1/2006 | Kornrumpf et al. ........ 359/619 |
| 7,224,070 | B2 * | 5/2007 | Yang .................. 257/777 |
| 2002/0195703 | A1 * | 12/2002 | Kameda .............. 257/710 |
| 2005/0090050 | A1 * | 4/2005 | Shim et al. ............ 438/200 |

FOREIGN PATENT DOCUMENTS

| JP | 11-145183 | 5/1999 |
| JP | 11-214586 | 8/1999 |
| JP | 2000-228487 | 8/2000 |
| JP | 2001-320012 | 11/2001 |
| JP | 2003-234362 | 8/2003 |
| JP | 2004-179576 | 6/2004 |
| JP | 2005-150179 | 6/2005 |
| JP | 2005276879 | 10/2005 |
| JP | 2006-54359 | 2/2006 |

* cited by examiner

*Primary Examiner* — Marcos D. Pizarro
*Assistant Examiner* — Sue Tang
(74) *Attorney, Agent, or Firm* — Rabin & Berdo, P.C.

(57) ABSTRACT

A semiconductor device having a first rectangular chip on which wires, electrode pads and chip mounting area are provided, a first dame formed on the first rectangular chip around the electrode pads and the chip mounting area so as to cover the wires and an under fill formed by filling liquid resin between a second rectangular chip mounted on the chip mounting area in a flip-chip manner and the first rectangular chip.

18 Claims, 10 Drawing Sheets

SEMICONDUCTOR DEVICE

CROSS-REFERENCE TO RELATED APPLICATION

This application claims priority under 35 USC 119 from Japanese Patent Application No. 2007-094716, the disclosure of which is incorporated by reference herein.

BACKGROUND OF THE INVENTION

1. Field of the Invention

The present invention relates to a semiconductor device and more specifically to a semiconductor device in which a semiconductor chip is mounted on a substrate in a flip-chip manner.

2. Description of Related Art

With the recent advance of highly-densified integration and packaging of electronic parts conforming to demands on high functional and light, thin, short and small electronic devices, MCM (multi-chip module) or SIP (system-in-package) type semiconductor devices using flip-chip packaging are becoming a main stream. Among this type of semiconductor devices, there is one that adopts a structure in which a semiconductor chip is packaged in a flip-chip manner on a packaging substrate, which is called as an interposer.

Figure 10A:
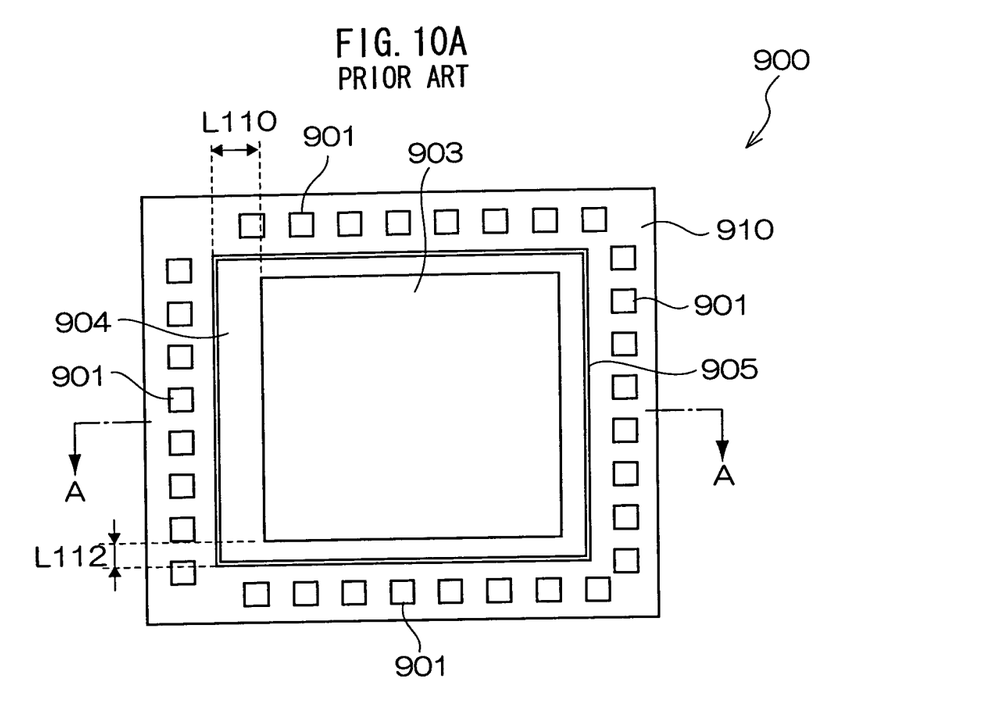
FIG. 10A is an upper plan view of a prior art semiconductor device.
Figure 10B:
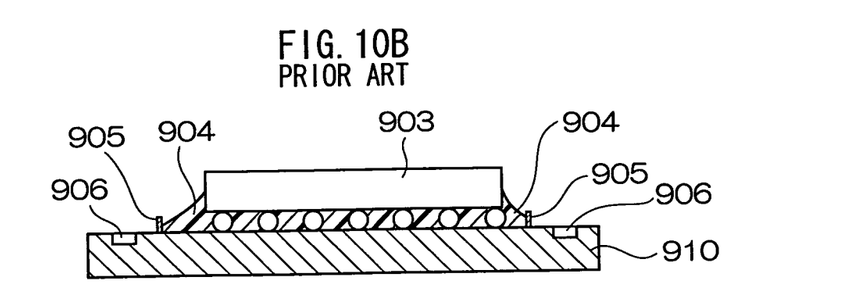
FIG. 10B is a section view of the prior art semiconductor device.

FIG. 10 shows a structure of a conventional semiconductor device (see Japanese Patent Application Laid-Open No. 2005-276879, for example). Here, FIG. 10A is a plan view thereof and FIG. 10B is a section view thereof. A semiconductor device 900 shown in the figures is composed of a substrate 910, a chip 903, a dam 905, an electrode pad 901 and a liquid resin 904. This chip 903 is characterized in that a distance L110 between a predetermined edge of a chip packaging area and the dam 905 corresponding to the predetermined edge is longer than a distance L112 between another edge of the chip packaging area and the dam 905 corresponding to the other edge.

The liquid resin 904 is discharged out to the area indicated by the distance L110 and is taken in and filled into a very small gap between the chip 903 and the substrate 910 by capillary phenomenon.

However, there has been a problem that when the liquid resin 904 is discharged further so as to fill the very small gap and to cover side faces of the chip, the liquid resin 904 may go over the dam 905, arriving at the electrode pad 901 and flowing out to side faces of the substrate 910.

Still more, in a case when the substrate 910 is a chip on which the wires are formed, the liquid resin may be adhered to the wires when the liquid resin flows out.

Furthermore, when the whole chip is sealed by sealing resin, into which fillers are mixed, for completing as a product, there is a possibility that the fillers may destroy a passivasion film covering the wires to cause a short-circuit to occur between the fillers within the sealing resin and the wires.

SUMMARY OF THE INVENTION

In view of the problems described above, the present invention has been made to achieve the following object.

That is, the object of the invention is to provide a highly reliable semiconductor device by protecting wires on the surface of a chip by preventing the liquid resin from flowing out.

As a result of an ardent study, the inventors has achieved the object described above by finding that the aforementioned problems may be solved by using the following semiconductor device manufacturing method.

That is, according to a first aspect of the invention, a semiconductor device has a first chip having a substantially rectangular shape in plan view (hereinafter "rectangular chip") on which wires, electrode pads and a chip mounting area are provided, a first dame formed on the first rectangular chip around the electrode pads and the chip mounting area so as to cover the wires and an under fill formed by filling liquid resin between a second rectangular chip mounted on the chip mounting area in a flip-chip manner and the first rectangular chip.

According to the semiconductor device of the first aspect of the invention, no liquid resin will flow out of the inner peripheral portion of the first dam even if the liquid resin is fill because the first dam is provided. Still more, because the wires are covered by the first dam, it is possible to suppress a passivasion film covering the wires from being destroyed even if the whole chip is covered by sealing resin into which fillers are mixed.

A semiconductor device of a second aspect of the invention further includes at least one chamfered portion at one corner of an inner peripheral portion of the first dam.

According to the semiconductor device of the second aspect of the invention, the liquid resin is readily filled between and spreads around the first and second rectangular chips by having the chamfered portion, in addition to the effect of the first aspect of the invention. In the same time, it facilitates the liquid resin to spread around the periphery along a boundary of the first dam, so that the liquid resin spreads over the entire inner peripheral section and covers the entire chip mounting area.

The semiconductor device of a third aspect of the invention has a region in which a distance between a predetermined side of the second rectangular chip and the first dam is longer than a distance between another side of the second rectangular chip and the first dam.

According to the semiconductor device of the third aspect of the invention, the liquid resin may be discharged to an opening reliably because the position where the liquid resin is discharged is set wide and droplets will not contact with the second rectangular chip or the first dam when the liquid resin is discharged.

A semiconductor device of a fourth aspect of the invention further includes a second dam formed so as to extend along the side face of the second rectangular chip in the region.

In a semiconductor device of a fifth aspect of the invention, a length of the second dam is equal to 35% or more and 48% or less of the side of the side face of the second rectangular chip and a width of the second dam is equal to 2% or more and 24% or less of the distance between the predetermined side of the second rectangular chip and the first dam.

A semiconductor device of a sixth aspect of the invention further includes a third dam formed so as to extend along the side face of the second rectangular chip on at least one part between the other side of the second rectangular chip and the first dam.

In a semiconductor device of a seventh aspect of the invention, a length of the third dam is equal to 80% or more and 120% or less of the length of the side face of the second rectangular chip and a width of the third dam is equal to 8% or more and 33% or less of the length from the side face of the second rectangular chip 12 to the first dam.

A semiconductor device of an eighth aspect of the invention further includes a fourth dam formed so as to protrude from at least one of the side faces of an inner peripheral portion of the first dam to the second rectangular chip.

According to the semiconductor devices of the fourth to eighth aspects of the invention, the whole opening may be further readily covered by the liquid resin discharged out to the opening because the discharged liquid resin spreads within the opening along the dams by surface tension, in addition to the effects of the first through third aspects.

A semiconductor device of a ninth aspect of the invention further includes a plurality of second rectangular chips on one and same plane of the chip mounting area, and a distance between the neighboring second rectangular chips is longer than a distance between the second rectangular chip and the first dam.

According to the semiconductor device of the ninth aspect of the invention, the under fill may be formed uniformly across the whole opening because the liquid resin is filled concurrently between the first and second rectangular chips even if the plurality of second rectangular chips is provided in the chip mounting area in addition to the effects of the first through eighth aspects.

As described above, according to the invention, it is possible to provide the highly reliable semiconductor device by preventing the flow-out of the liquid resin for protecting the wires on the surface of the chips.

BRIEF DESCRIPTION OF THE DRAWINGS

Preferred exemplary embodiments of the present invention will be described in detail based on the following figures, wherein.

DETAILED DESCRIPTION OF THE INVENTION

Preferred embodiments of a semiconductor device of the invention will be explained below with reference to the drawings. It is noted that an overlapped explanation will be omitted.

<Semiconductor Device>

First Embodiment

Figure 1A:
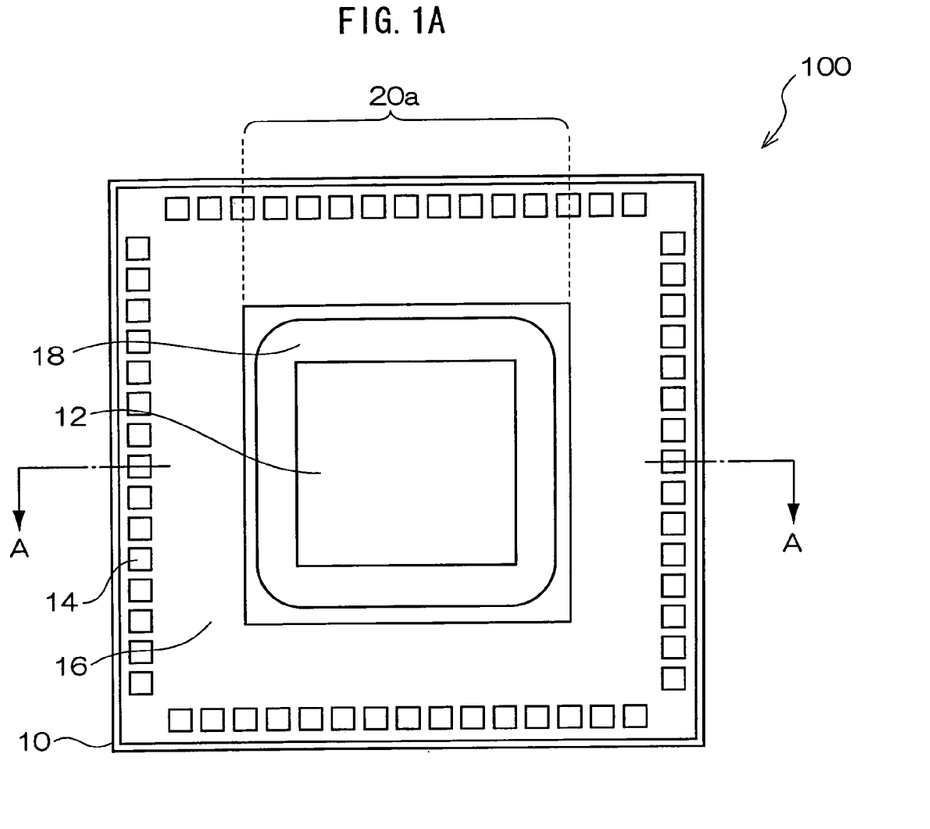
FIG. 1A is an upper plan view of a semiconductor device of a first embodiment of the invention.
Figure 1B:
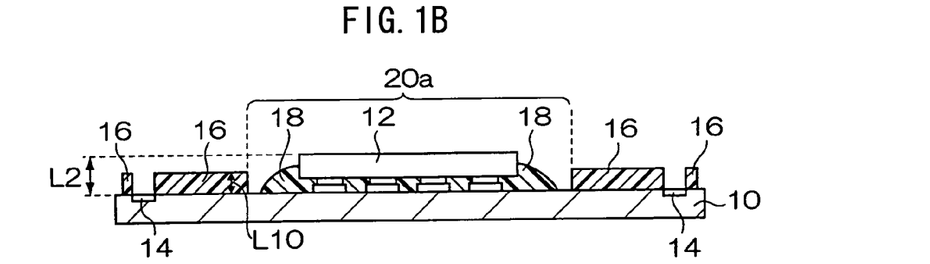
FIG. 1B is a section view taken along a line A-A in the upper plan view.
Figure 2:
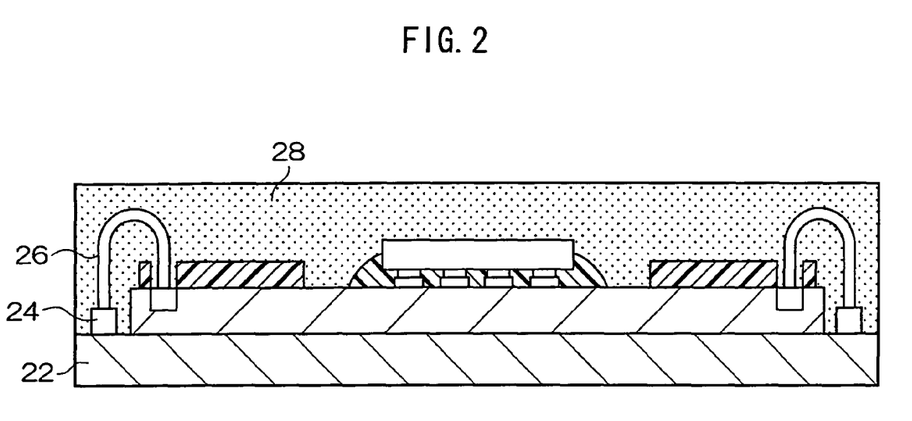
FIG. 2 is a section view showing a state in which the semiconductor device of the first embodiment of the invention is molded by sealing resin in which fillers are mixed.

FIG. 1A is an upper plan view of a semiconductor device 100 of a first embodiment of the invention and FIG. 1B is a section view taken along a line A-A in the upper plan view. FIG. 2 is a section view showing a state in which the semiconductor device 100 is molded by sealing resin in which fillers are mixed.

In FIG. 1A, a semiconductor device 100 includes a first rectangular chip 10, on which wires (not shown), electrode pads 14 and a chip mounting area are provided, a first dam 16 formed on the first rectangular chip 10 to cover the wires (not shown), a second rectangular chip 12 mounted in a flip-chip manner on the chip mounting area, and under fill 18 formed by filling liquid resin between the second rectangular chip 12 and the first rectangular chip 10.

As shown in FIG. 1B, the first dam 16 has a region for forming the electrode pads 14 and the inner peripheral section 20a.

In FIG. 2, the electrode pad 14 on the first rectangular chip 10 is electrically connected with an electrode pad 24 on a wiring board 22, which is disposed on the bottom of the first rectangular chip 10, by a bonding wire 26. Further, the electrode pad 14, the first dam 16, the bonding wire 26, the under fill 18, the first rectangular chip 10 and the second rectangular chip 12 are covered and sealed by sealing resin 28.

Each component will be described in detail later.

[First Rectangular Chip]

As shown in FIG. 1B, the first rectangular chip 10 is provided with the chip mounting area located substantially at its center and the electrode pad 14 disposed at periphery of the chip mounting area. The first rectangular chip 10 is also provided with wires (not shown) on the surface thereof and with a passivasion film (not shown) so that a portion for connecting with the second rectangular chip 12 and the electrode pad 14 are exposed in the chip mounting area.

[First Dam]

In FIG. 1B, the first dam 16 is provided with a region for forming the electrode pad 14 and the inner peripheral section 20a. The inner peripheral section 20a has a rectangular shape as shown in FIG. 1A.

Although a material of the first dam 16 is not specifically limited as long as it is an insulating material, it is preferable to be polyimide from a point of view of moldability and heat resistance of the dam. A material of the second rectangular chip 12 may be any conductive material as long as it does not short with the electrode section because the chip 12 is covered by the passivasion film.

The height of the first dam 16 is not specifically limited as long as liquid resin (to be described later) does not flow out to the electrode pad 14 until the under fill 18 is formed after the liquid resin is discharged. The way in which the plurality of the second rectangular chips 12 are laminated in a vertical direction is the same throughout the second to fourth embodiments which are described later.

The first dam 16 also has a purpose of protecting the wires formed on the surface of the first rectangular chip 10 from fillers within the sealing resin 28 described before.

The first dam 16 has the above described height and area and is formed so as to further cover a region between the electrode pad 14 formed on the first rectangular chip 10 and an edge of the first rectangular chip 10.

[Under Fill, Liquid Resin]

In FIG. 1B, the under fill 18 is formed so as to cover the gap (space) between the first rectangular chip 10 and the second rectangular chip 12, and to cover side faces of the second rectangular chip 12. The liquid resin is discharged into a gap between the first dam 16 and the second rectangular chip 12 after the second rectangular chip 12 is mounted in the flip-chip manner. The liquid resin is then absorbed into a gap between the first rectangular chip 10 and the second rectangular chip 12 by a capillary phenomenon to form the under fill 18 so as to cover the side faces of the second rectangular chip 12.

The liquid resin material used has very small fillers and low viscosity because it is to be injected into the region where a distance between the chips is 10 to 30 μm.

[First Rectangular Chip, Second Rectangular Chip, Chip Mounting Area, Flip-Flop Mounting]

As shown in FIG. 1B, the second rectangular chip 12 is mounted in the chip mounting area of the first rectangular chip 10 in the flip-chip manner. The flip-chip mounting means to mount the second rectangular chip 12 on the first rectangular chip 10 by facing an active surface of the second rectangular chip 12 to the first rectangular chip 10, i.e., in a manner of so-called face-down. The connection portions between the second rectangular chip 12 and the first rectangular chip 10 are electrically connected by soldering or the like.

The chip mounting area on the first rectangular chip 10 is parted into a substantially rectangular shape so as to have an area substantially equal to an area of the second rectangular chip 12.

The distance between the first rectangular chip 10 and the second rectangular chip 12 is not specifically limited as long as the liquid resin described above is absorbed into a gap between the first rectangular chip 10 and the second rectangular chip 12 by the capillary phenomenon.

[Wires, Electrode Pads]

In the semiconductor device of the invention, the wires (not shown) and the electrode pads 14 are provided on the first rectangular chip 10.

The conventional metals such as Al, Cu, Au and the like may be used as the material of the wires and the electrode pad 14.

[Sealing Resin]

The first rectangular chip 100 shown in FIG. 1 is sealed by the sealing resin 28 into which the fillers are mixed in FIG. 2.

A material of the sealing resin 28 may be epoxy resin for example.

It is preferable to mix the fillers into the sealing resin 28 from a point of view of improving its environmental resistance (heat cycle). The fillers used here may be particles such as $Al_2O_3$, silica and others. Although a globular shape is preferable as a shape of those particles, they may have a deformed shape.

Second Embodiment

Figure 3A:
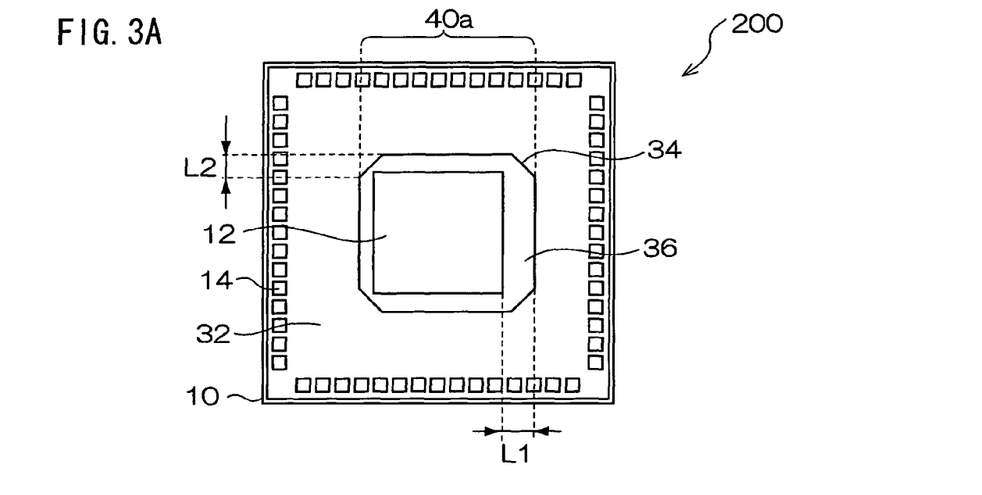
FIG. 3A is an upper plan view of the semiconductor device of a second embodiment of the invention.
Figure 3B:
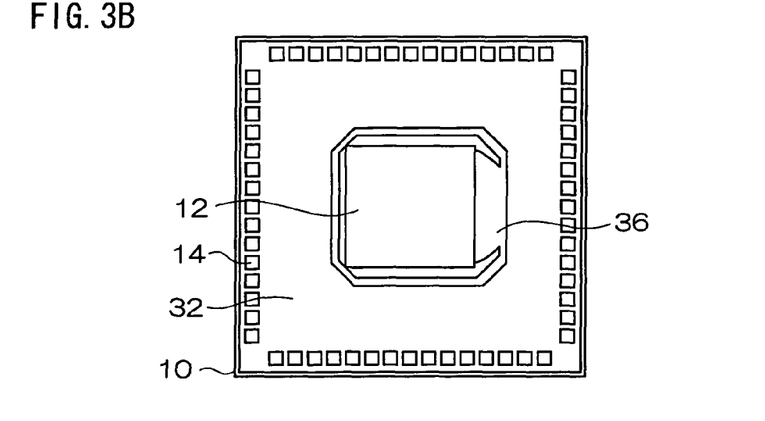
FIG. 3B is an upper plan view of the semiconductor device of the second embodiment of the invention.
Figure 3C:
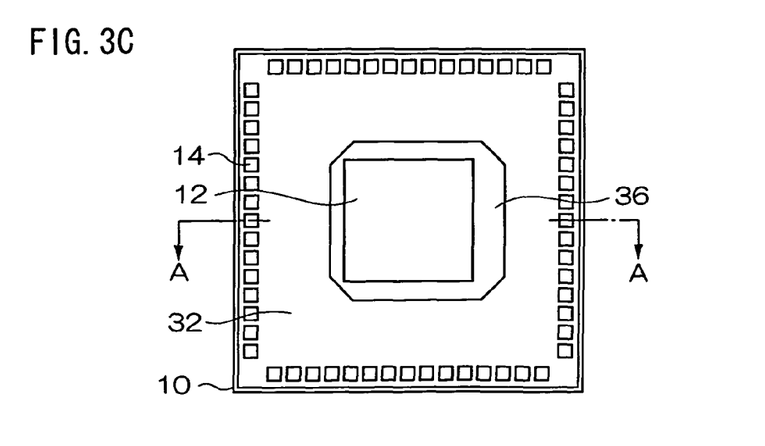
FIG. 3C is an upper plan view of the semiconductor device of the second embodiment of the invention.
Figure 4:
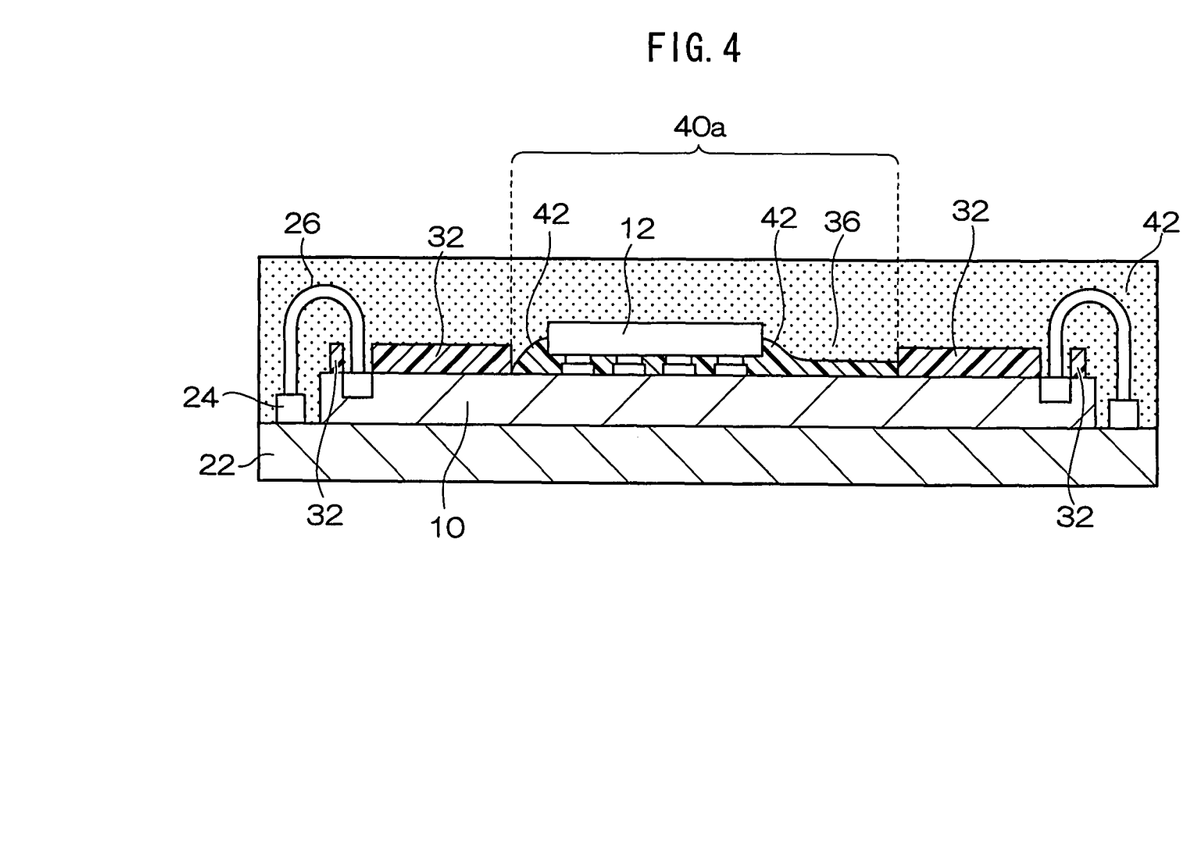
FIG. 4 is a section view showing a state in which the semiconductor device of the second embodiment of the invention is molded by sealing resin in which fillers are mixed.

A second preferred embodiment of the semiconductor device of the invention will be explained with reference to FIGS. 3A-3C. FIGS. 3A-3C are upper plan views of the semiconductor device 200 of the second embodiment of the invention. FIG. 4 is a section view showing a state in which the semiconductor device 200 is molded by sealing resin into which fillers are mixed.

When the liquid resin is discharged out to a region 36 indicated in FIG. 3A, the liquid resin spreads along a lower part and the side faces 40a of the second rectangular chip 12 as shown in FIG. 3B and is filled over the entire surface of the inner peripheral section 40a as shown in FIG. 3C.

The semiconductor device 200 shown in FIGS. 3A-3C has a chamfered portion 34 at least one corner of the inner peripheral section 40a, having a chip mounting area exposed in a rectangular shape. This is preferable because the liquid resin is facilitated to expand on the whole surface of the inner peripheral section 40a. Accordingly, it is more preferable to form the chamfered portions 34 at four corners as shown in FIG. 3A.

The chamfered portion 34 may be a C-face or R-face.

In case of the C-face, it is preferable that a length of a C-face portion is L1 and an angle thereof is 45°. In case of the R-face, it is preferable that a radius of the R-face is 150 to 180% of L1. Further, it is more preferable the radius of the R-face is 160 to 170% of L1.

Furthermore, the second embodiment of the semiconductor device of the invention is characterized in that it includes a region in which a distance between a predetermined side of the second rectangular chip 12 and the first dam 32 is longer than a distance between another side of the second rectangular chip 12 and the first dam 32.

Here, the "distance between the predetermined side of the second rectangular chip 12 and the first dam" is L1 in FIG. 3A for example. Further, the distance between another side of the second rectangular chip 12 and the first dam" is L2 in FIG. 3A.

A region 36 is "a region in which a distance between a predetermined side of the second rectangular chip 12 and an edge of the substrate corresponding to the predetermined edge is longer than a distance between another side of the second rectangular chip 12 and an edge of the substrate corresponding to the other side".

A relationship between L1 and L2 is preferable to be L1>L2 and its ratio is preferable to be L1:L2=7:2 through 6:1. It becomes possible to readily set a position where the liquid resin is discharged and to suppress a leak or the like in discharging the liquid resin by setting the ratio in these ranges.

FIG. 4 is a section view of the second embodiment of the semiconductor device having the inner peripheral section 40a provided as described above.

It can be seen that the second rectangular chip 12 provided in the inner peripheral section 40a is disposed at an eccentric position by proving the region 36.

Still more, it is possible to provide the highly reliable semiconductor device without destroying the passivasion film covering the surface of the first rectangular chip 10 because the under fill 42 formed by the liquid resin covers the whole surface of the inner peripheral section 40a.

Third Embodiment

Figure 5A:
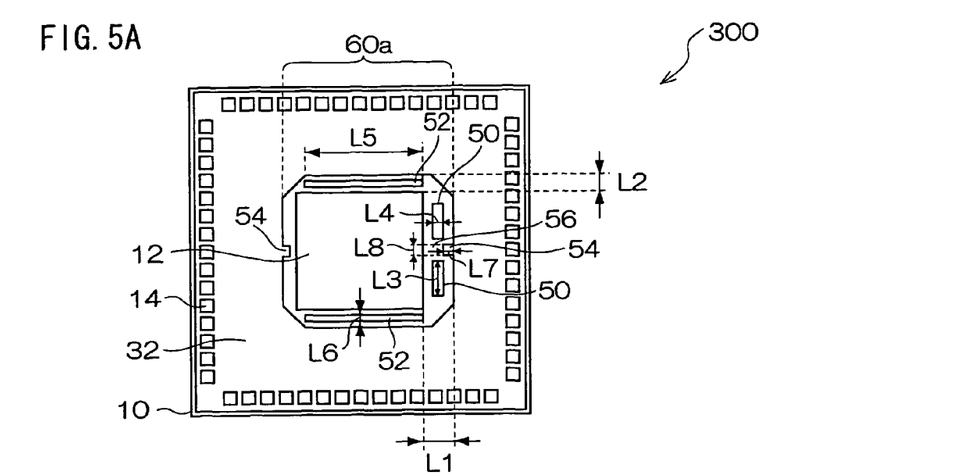
FIG. 5A is an upper plan view of the semiconductor device of a third embodiment of the invention.
Figure 5B:
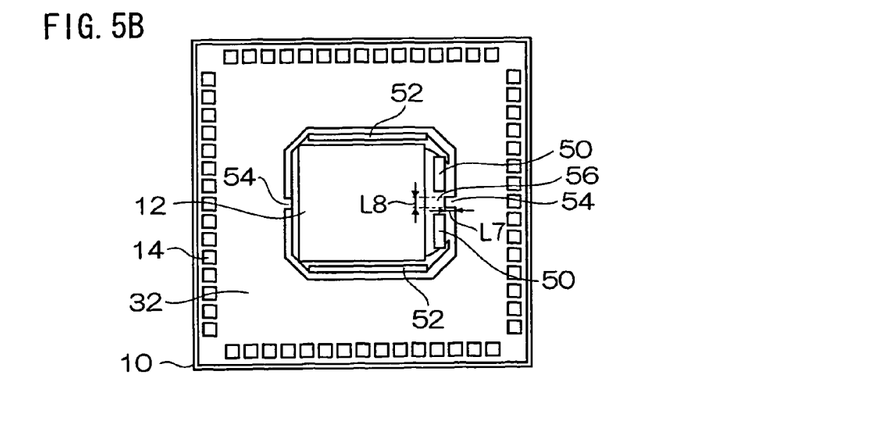
FIG. 5B is an upper plan view of the semiconductor device of the third embodiment of the invention.
Figure 5C:
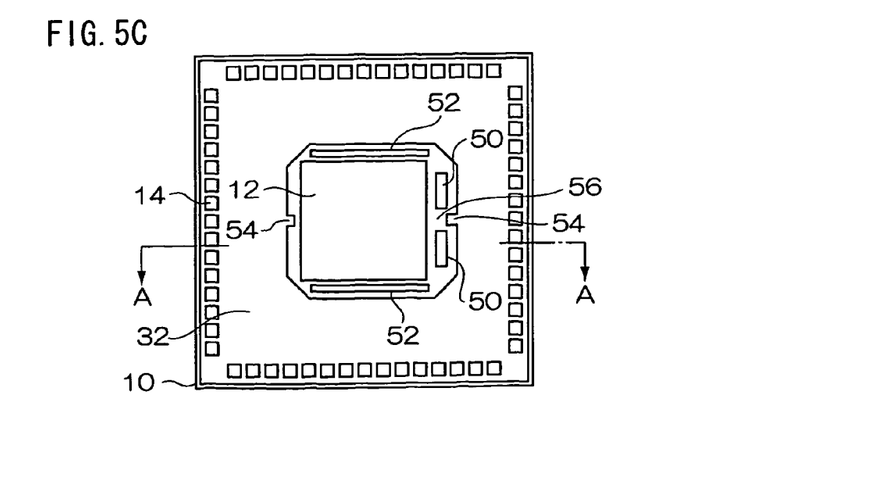
FIG. 5C is an upper plan view of the semiconductor device of the third embodiment of the invention.
Figure 6:
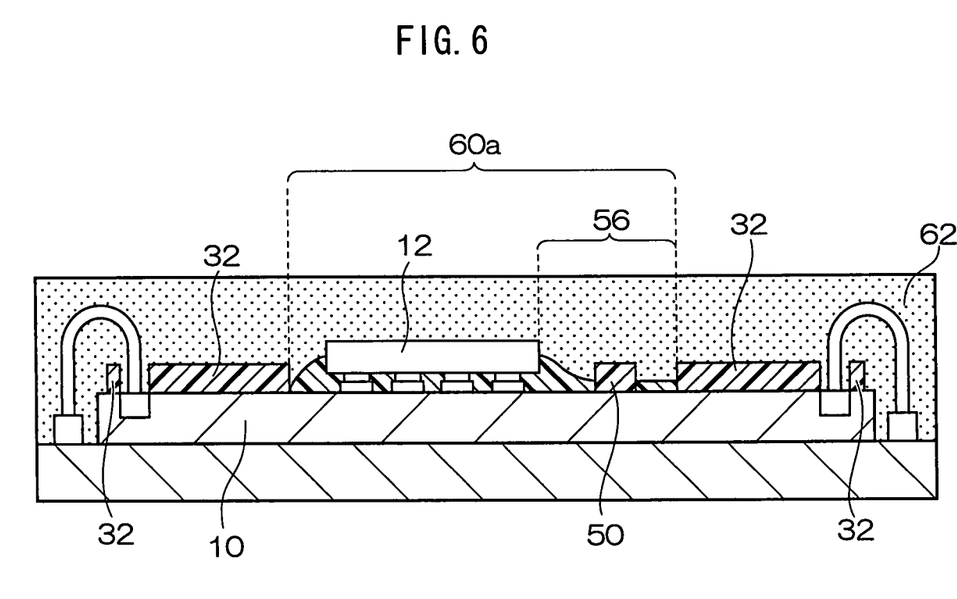
FIG. 6 is a section view showing a state in which the semiconductor device of the third embodiment of the invention is molded by sealing resin in which fillers are mixed.

A third preferred embodiment of the semiconductor device of the invention will be explained with reference to FIGS. 5A through 5C. FIGS. 5A through 5C are upper plan views of the semiconductor device 300 of the third embodiment of the invention. FIG. 6 is a section view showing a state in which the semiconductor device 300 is molded by sealing resin in which fillers are mixed.

The semiconductor device 300 shown in FIGS. 5A through 5C includes a second dam 50 formed so as to extend along the side face of the second rectangular chip 12 in a region 56. Furthermore, the semiconductor device 300 includes a third dam 52 formed so as to extend along the side face of the second rectangular chip 12 in at least one part between the other side of the second rectangular chip 12 and the first dam 32. Still more, the semiconductor device 300 includes a fourth dam 54 formed so as to protrude at least from one side face of an inner peripheral section 60a to the second rectangular chip 12.

It becomes possible to control a flow of the liquid resin discharged out to the region 56 by providing these dams. Still more, because the liquid resin spreads over the inner peripheral section 60a, whole inner peripheral section 60a may be covered by the liquid resin more readily.

—Second Dam—

A length L3 of the second dam 50 is preferably be 35% or more and 48% or less of a length of the side face of the second rectangular chip 12. A width L4 of the second dam 50 is preferably 2% or more and 23% or less of the distance L1 between the predetermined side of the second rectangular chip 12 and the first dam 32. A plurality of such second dams 50 may be disposed in the region 56. When the length L3 of the second dam 50 is less than a half of the length of the side face of the second rectangular chip 12, a plurality of second dams 50 may be disposed along the side face of the second rectangular chip 12 as shown in FIGS. 5A through 5C. Or more preferable, the plurality of second dams 50 may be disposed in parallel with the side face of the second rectangular chip 12.

When the plurality of second dams is disposed, a distance between the neighboring second dams 50 is preferably 9% or more and 400% or less of the second dam 50 from a point of view of bringing about the capillary phenomenon of the liquid resin.

—Third Dam—

A third dam 50 is disposed in a region indicated by L2 in FIG. 5A. It becomes possible to control a flow of the liquid resin so as to spread along an outer peripheral portion of an inner peripheral section 60a by disposing the third dam 50.

A length L50 of the third dam 50 is preferable to be equal to 80% or more and 120% or less of the length of the second rectangular chip 12. A width L6 of the third dam 50 is preferable to be equal to 8% or more and 33% or less of the length from the side face of the second rectangular chip 12 to the first dam 32.

—Fourth Dam—

A fourth dam 54 is formed so as to protrude from at least one side faces of the inner peripheral section 60a to the second rectangular chip 12.

It is preferable to provide the fourth dam 54 as shown in FIGS. 5A to 5C when the length L3 of the second dam 50 is less than a half of the length of the side face of the second rectangular chip 12. It becomes possible to control the flow of the liquid resin more readily and to spread over the entire inner peripheral section 60a.

A width L8 of the fourth dam 54 is desirable to be the same with the width of the second dam 50 from a point of view of processing the dams. A length L7 of the fourth dam 54 is preferable to be 20 to 50% of the length L1 between the side face of the second rectangular chip 12 and the first dam 32 from a point of view of flow of the liquid resin.

It is preferable to form the fourth dams 54 at all of the side faces of the inner peripheral section 60a, although this depends on the distance between the second rectangular chip 12 and the first dam 32. Furthermore, it is preferable to position the fourth dam 54 at a center part of the side face of the inner peripheral section 60a so that the liquid resin spreads uniformly.

The material and height of the second dam 50, the third dam 50 and the fourth dam 54 are the same with that of the first dam described above from a point of view of facilitating the production.

Fourth Embodiment

Figure 7A:
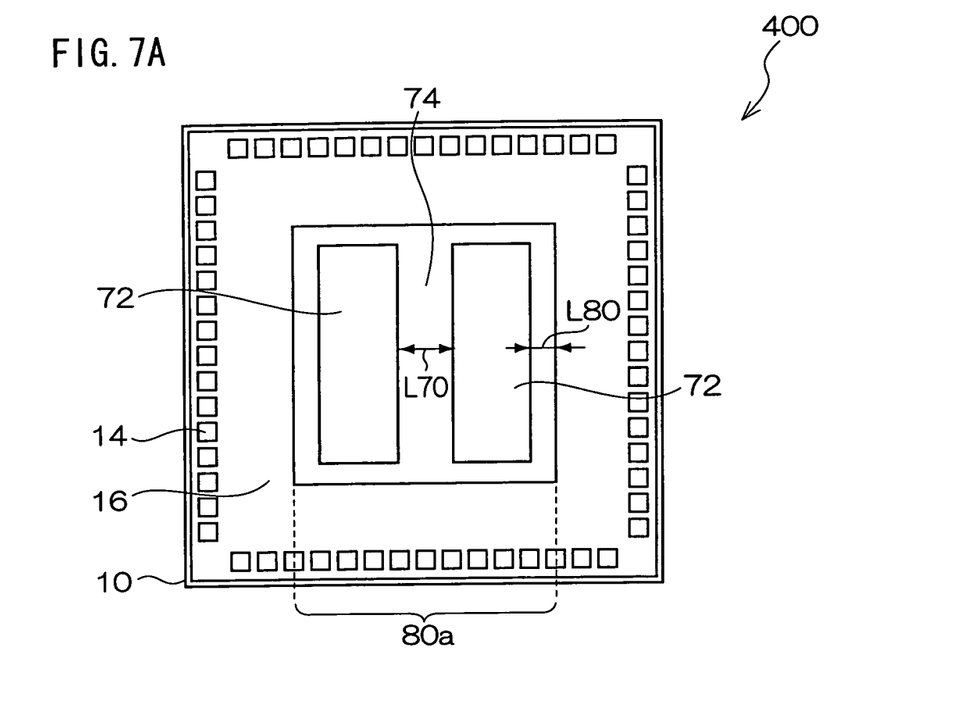
FIG. 7A is an upper plan view of the semiconductor device of a fourth embodiment of the invention.
Figure 7B:
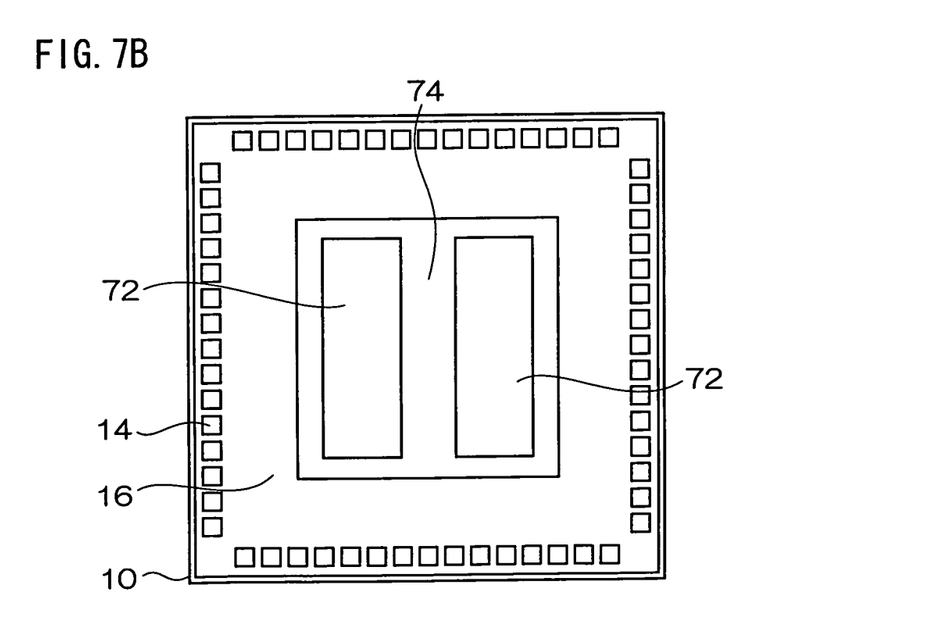
FIG. 7B is an upper plan view of the semiconductor device of the fourth embodiment of the invention.
Figure 8:
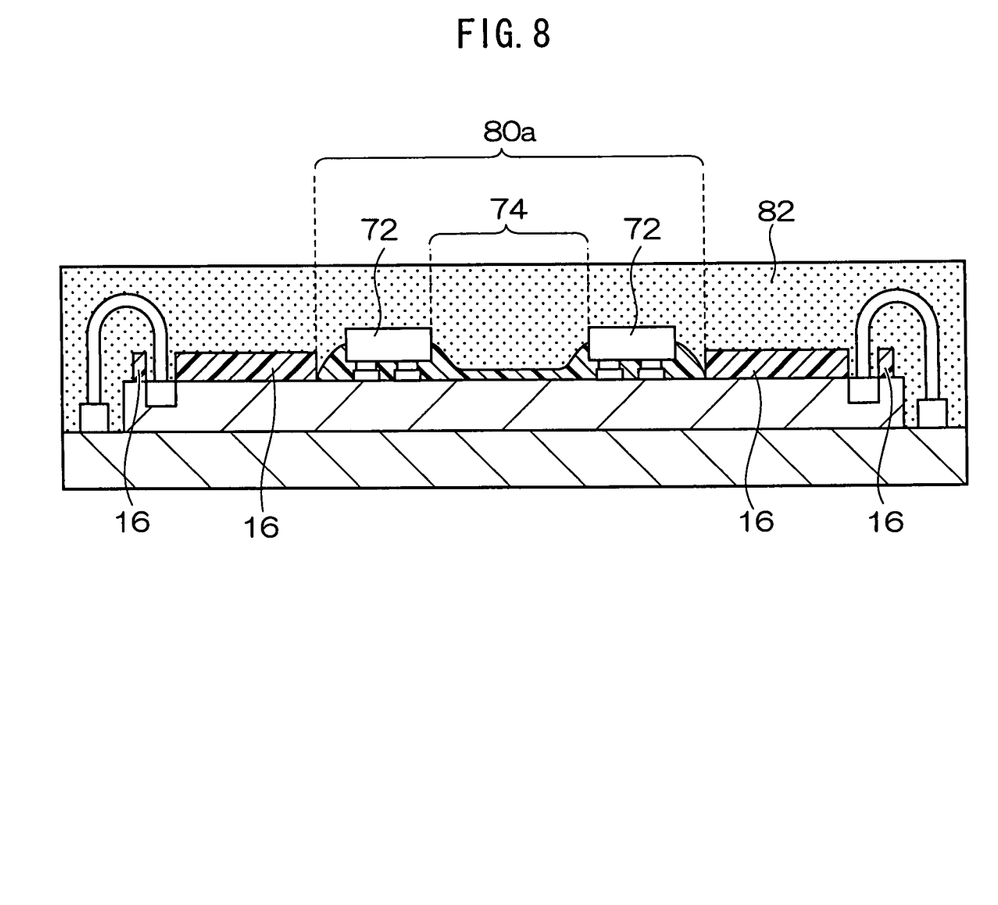
FIG. 8 is a section view showing a state in which the semiconductor device of the fourth embodiment of the invention is molded by sealing resin in which fillers are mixed.

A fourth preferred embodiment of the semiconductor device of the invention will be explained with reference to FIGS. 7A and 7B. FIGS. 7A and 7B are upper plan views of the semiconductor device 400 of the fourth embodiment of the invention. FIG. 8 is a section view showing a state in which the semiconductor device 400 is molded by sealing resin 82 into which fillers are mixed.

The semiconductor device of the fourth embodiment of the invention has a plurality of second rectangular chips 72 on one plane of the chip mounting area as shown in FIGS. 7A and 7B. A distance L70 between the neighboring second rectangular chips 72 is longer than a distance L80 between the second rectangular chip 72 and the first dam 16.

A region 74 between the two neighboring second rectangular chips 72 is disposed substantially at the center of the chip mounting area. Thereby, the liquid resin is filled concurrently between the first rectangular chip 10 and the second rectangular chip 72 even if the plurality of second rectangular chips 72 is provided on the chip mounting area. Accordingly, it becomes possible to form the uniform under fill across an entire inner peripheral section 80a.

The region 74 is not positioned between the second rectangular chip 72 and the first dam 16 because the liquid resin is hardly filled under the second rectangular chip 72 by capillary phenomenon with the neighboring second rectangular chip 72 after discharging the liquid resin.

A distance L70 between the neighboring pluralities of second rectangular chips 72 is preferable to be equal to 100% or more and 400% or less of the distance L80 between the second rectangular chip 72 and the first dam 16 from a point of view of reliably discharging the liquid resin to the inner peripheral section 80a.

The number of the second rectangular chips 72 is not specifically limited because it depends on an area of the second rectangular chip 72 and a chip mounting area.

<Manufacturing Method of Semiconductor Device>

The semiconductor device of the invention may be manufactured as follows for example. Fabrication steps of the first embodiment will be explained in outline for example.

—First Step—

Figure 9A:
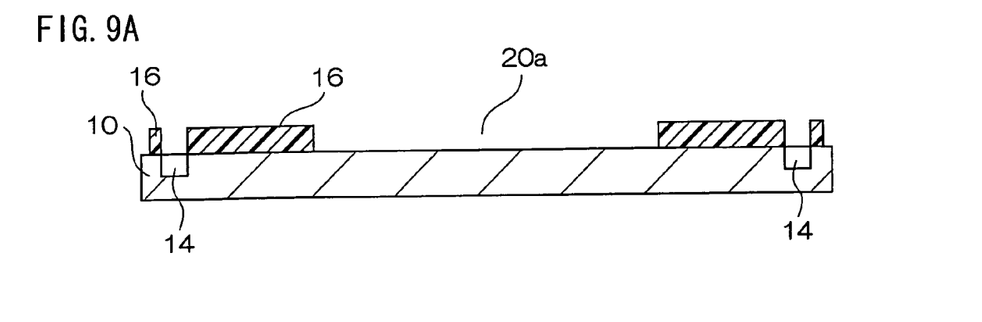
FIG. 9A is a section view of a processing step of the semiconductor device of the invention.

The first rectangular chip 10 on which the electrode pad 14 is formed through predetermined semiconductor fabrication processes (film forming process and the like) is prepared, and the first dam 16 having the inner peripheral section 20a that exposes the electrode pad 14 and the chip mounting area is formed on the first rectangular chip 10 as shown in FIG. 9A.

—Second Step—

Figure 9B:
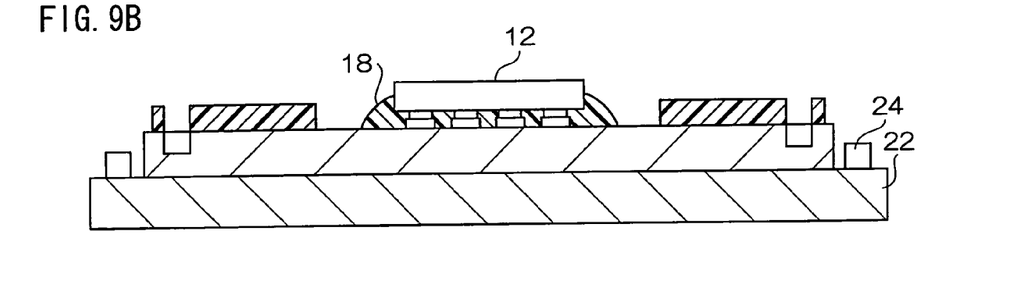
FIG. 9B is a section view of the processing step of the semiconductor device of the invention.

Next, the second rectangular chip 12 is mounted on the chip mounting area in the flip-chip manner and the liquid resin is discharged between the second rectangular chip 12 and the first dam 16. The discharged liquid resin is absorbed into the gap between the first rectangular chip 10 and the second rectangular chip 12 by the capillary phenomenon (capillarity) and the absorbed liquid resin flows out also to a face on the side opposite from the side to which the liquid resin is discharged. It is then thermally hardened, forming the under fill 18.

Figure 9C:
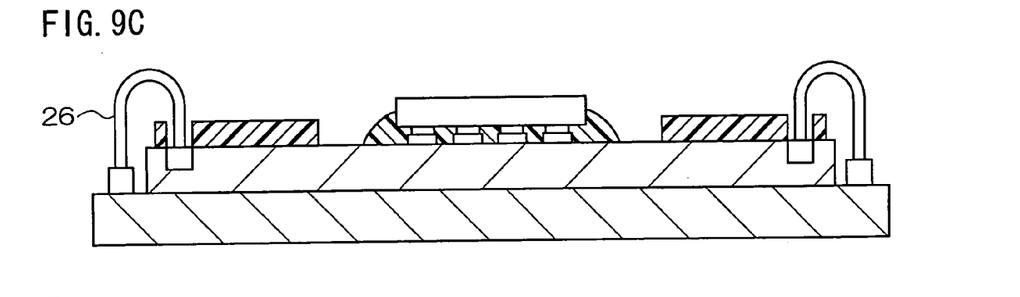
FIG. 9C is a section view of the processing step of the semiconductor device of the invention.

Next, the first rectangular chip 10 is mounted on a wiring board 22.

—Third Step—

After that, the electrode pad 14 of the first rectangular chip 10 is electrically connected with the electrode pad 24 on the wiring board 22 by the bonding wire 26.

—Fourth Step—

Figure 9D:
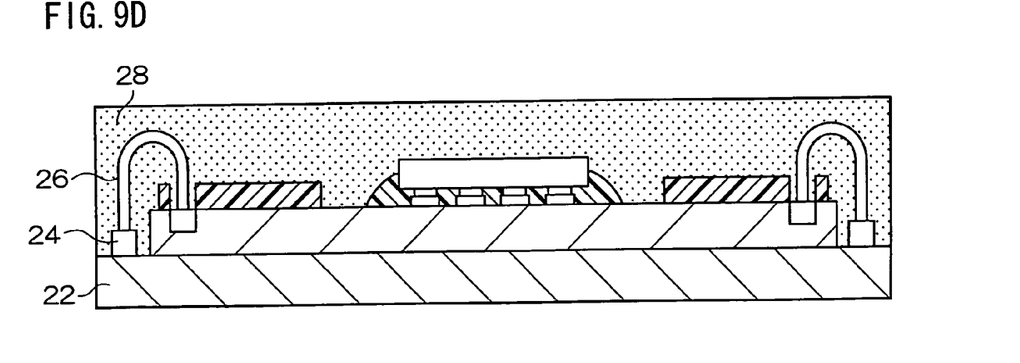
FIG. 9D is a section view of the processing step of the semiconductor device of the invention.

Finally, the entire semiconductor device is covered by the sealing resin 28, into which silica particles are mixed, thus completing the semiconductor device of the first embodiment.

Beside the steps described above, it is also possible to prepare the first rectangular chip 10 in a state of a wafer, to fabricate the first rectangular chip 10 on which the second rectangular chip 12 is mounted by dicing the wafer after forming the under fill 18 of the second step and then to mount the first rectangular chip 10 on the wiring board 22.

As described above, it is possible to provide the highly reliable semiconductor device by the present invention by preventing the flow-out of the liquid resin and by forming the dams so as to protect the passivasion film on the wires.

It is noted that the present embodiments should not be construed definitively and it is needless to say that they may be realized within in a scope satisfying the elements of the invention.

What is claimed is:

1. A semiconductor device, comprising:
    a first substantially rectangular chip having a top surface on which wires, electrode pads and a chip mounting area are provided;
    a first dam formed on the top surface of the first substantially rectangular chip around the electrode pads and the chip mounting area so as to cover the wires;
    a second substantially rectangular chip mounted on the chip mounting area in a flip-chip manner, the second substantially rectangular chip having first and second sides that are substantially perpendicular to each other in a plan view;
    an under fill formed by filling liquid resin into a space between a top surface of the second substantially rectangular chip and the top surface of the first substantially rectangular chip;
    a second dam formed on the top surface of the first substantially rectangular chip, between the first dam and the first side of the second substantially rectangular chip, and extending along the first side; and
    a third dam formed on the top surface of the first substantially rectangular chip, between the first dam and the second side of the second substantially rectangular chip, and extending along the second side, wherein
    the first dam protects the wires and keeps the wires isolated from the liquid resin.

2. The semiconductor device according to claim 1, further comprising at least one chamfered portion at one corner of an inner peripheral portion of the first dam.

3. The semiconductor device according to claim 2, wherein there is provided a region having a distance between the first side of the second substantially rectangular chip and the first dam which is longer than a distance between the second side of the second substantially rectangular chip and the first dam.

4. The semiconductor device according to claim 2, wherein a length of the second dam is 35% to 48% of the first side of the second substantially rectangular chip, and a width of the second dam is 2% to 24% of the distance between the first side of the second substantially rectangular chip and the first dam.

5. The semiconductor device according to claim 1, wherein there is provided a region having a distance between the first side of the second substantially rectangular chip and the first dam which is longer than a distance between the second side of the second substantially rectangular chip and the first dam.

6. The semiconductor device according to claim 1, wherein a length of the second dam is 35% to 48% of the first side of the second substantially rectangular chip, and a width of the second dam is 2% to 24% of the distance between the first side of the second substantially rectangular chip and the first dam.

7. The semiconductor device according to claim 1, wherein a length of the third dam is 80% to 120% of the length of the second side of the second substantially rectangular chip and a width of the third dam is 8% to 33% of the length from the second side of the second substantially rectangular chip to the first dam.

8. The semiconductor device according to claim 1, further comprising a fourth dam formed so as to protrude from at least one of the side faces of an inner peripheral portion of the first dam to the second substantially rectangular chip.

9. The semiconductor device according to claim 1, further comprising a plurality of second substantially rectangular chips on the same plane of the chip mounting area, wherein a distance between the neighboring second substantially rectangular chips is greater than a distance between the second substantially rectangular chip and the first dam.

10. A semiconductor device, comprising:
    a first substantially rectangular chip having a top surface on which wires, electrode pads and a chip mounting area are provided;
    a first dam formed on the top surface of the first substantially rectangular chip around the electrode pads and the chip mounting area, the wires being beneath the first dam and being covered by the first dam;
    a second substantially rectangular chip mounted on the chip mounting area in a flip-chip manner, the second substantially rectangular chip having first and second sides that are substantially perpendicular to each other in a plan view;
    an under fill formed by filling liquid resin into a space between a top surface of the second substantially rectangular chip and the top surface of the first substantially rectangular chip,
    a second dam formed on the top surface of the first substantially rectangular chip, between the first dam and the first side of the second substantially rectangular chip, and extending along the first side; and
    a third dam formed on the top surface of the first substantially rectangular chip, between the first dam and the second side of the second substantially rectangular chip, and extending along the second side.

11. The semiconductor device according to claim 10, further comprising at least one chamfered portion at one corner of an inner peripheral portion of the first dam.

12. The semiconductor device according to claim 11, wherein there is provided a region having a distance between the first side of the second substantially rectangular chip and the first dam which is longer than a distance between the second side of the second substantially rectangular chip and the first dam.

13. The semiconductor device according to claim 11, wherein a length of the second dam is 35% to 48% of the first side of the second substantially rectangular chip, and a width of the second dam is 2% to 24% of the distance between the first side of the second substantially rectangular chip and the first dam.

14. The semiconductor device according to claim 10, wherein there is provided a region having a distance between the first side of the second substantially rectangular chip and the first dam which is longer than a distance between the second side of the second substantially rectangular chip and the first dam.

15. The semiconductor device according to claim 10, wherein a length of the second dam is 35% to 48% of the first side of the second substantially rectangular chip, and a width of the second dam is 2% to 24% of the distance between the first side of the second substantially rectangular chip and the first dam.

16. The semiconductor device according to claim 10, wherein a length of the third dam is 80% to 120% of the length of the second side of the second substantially rectangular chip and a width of the third dam is 8% to 33% of the length from the second side of the second substantially rectangular chip to the first dam.

17. The semiconductor device according to claim 10, further comprising a fourth dam formed so as to protrude from at least one of the side faces of an inner peripheral portion of the first dam to the second substantially rectangular chip.

18. The semiconductor device according to claim 10, further comprising a plurality of second substantially rectangular chips on the same plane of the chip mounting area, wherein a distance between the neighboring second substantially rectangular chips is greater than a distance between the second substantially rectangular chip and the first dam.

* * * * *